United States Patent [19]
Ohmi et al.

[11] Patent Number: 5,858,106
[45] Date of Patent: Jan. 12, 1999

[54] CLEANING METHOD FOR PEELING AND REMOVING PHOTORESIST

[75] Inventors: Tadahiro Ohmi, Miyagi-den; Senri Ojima, Miyagi-ken; Takahisa Nitta, Bunkyo-ku, all of Japan

[73] Assignee: Tadahiro OHMI, Miyagi-ken, Japan

[21] Appl. No.: 781,229

[22] Filed: Jan. 10, 1997

[30] Foreign Application Priority Data

| Jan. 12, 1996 | [JP] | Japan | ................................ 8-003757 |
| May 10, 1996 | [JP] | Japan | ................................ 8-116850 |
| Jul. 5, 1996 | [JP] | Japan | ................................ 8-195688 |

[51] Int. Cl.⁶ .................................................. B08B 3/12
[52] U.S. Cl. .................................... 134/1; 134/3; 134/28
[58] Field of Search ............................ 134/1, 2, 3, 28, 134/29, 38

[56] References Cited

U.S. PATENT DOCUMENTS

| 3,988,256 | 10/1976 | Vandermey et al. ................. 134/42 |
| 4,178,188 | 12/1979 | Dussault et al. ..................... 134/1 |
| 4,778,532 | 10/1988 | McConnell et al. ................. 134/10 |
| 5,100,476 | 3/1992 | Mase et al. .......................... 134/1 |
| 5,286,657 | 2/1994 | Barn ..................................... 134/1 |
| 5,468,302 | 11/1995 | Thietje ................................ 134/1 |
| 5,529,887 | 6/1996 | Horn et al. .......................... 134/2 |
| 5,690,747 | 11/1997 | Doscher ............................. 134/1 |

*Primary Examiner*—Jill Warden
*Assistant Examiner*—Saeed Chaudhry
*Attorney, Agent, or Firm*—Randall J. Knuth

[57] ABSTRACT

A cleaning method for peeling and removing photoresists from a semiconductor by applying ultrasound to a cleaning solution comprising a mixture of an organic solvent diluted with pure water and halogenated alkali metal salts, hydrofluoric acid, or ammonium fluoride. The cleaning method removes organic film such as a photoresist or the like at room temperature, not by dissolving, but rather by peeling. The cleaning liquid does not degrade over a long period of time and, moreover, has a strong cleaning effect yet chemical vapors and water vapors are essentially not generated.

25 Claims, 6 Drawing Sheets

CLEANING METHOD FOR PEELING AND REMOVING PHOTORESIST

BACKGROUND OF THE INVENTION

1. Field of the Invention

The present invention relates to a cleaning method and a cleaning apparatus, and more particularly relates to a cleaning method and a cleaning apparatus which are capable of peeling off and removing a photoresist or the like at room temperatures.

2. Description of the Related Art

Conventionally, in the wet processes of semiconductor or liquid crystal display manufacture, the peeling off of the resist was conducted by mixing sulfuric acid and an aqueous hydrogen peroxide solution and conducting high temperature treatment within a range of 100°–150° C. Alternatively, methods were employed in which, after treatment at high temperatures with an organic solvent at a high concentration, the organic solvent deposited on the substrate was further treated by means of a different organic solvent. Furthermore, when ion implantation or reactive ion etching is conducted using the photoresist as a mask, large amounts of ions are irradiated onto the resist surface, and the resist material itself is essentially carbonized, so that removal can not be conducted by means of chemicals, and thus a method is introduced in which plasma treatment is conducted by means of an oxygen plasma or by means of UV rays and ozone gas, and after the carbonized portions of the resist have been removed by incineration; the remainder of the resist is removed by chemicals.

However, the method in which sulfuric acid or hydrogen peroxide is employed has many defects, in that the operability of the cleaning fluid and silicon wafer conveyance is poor because the treatment is conducted at high temperatures, and furthermore, since the hydrogen peroxide in the cleaning liquid breaks down, there is difficulty in the management of the fluid, so that chemical and water vapors are generated in large amounts and large amounts of clean air are required for the removal thereof, and scrubbers are necessary for the removal of the chemical vapors from the exhaust air, and the like, so that the costs both in terms of power consumption and machinery are high, and there are costs involved with the treatment of the sulfuric acid waste liquid.

The method in which organic solvents are employed also has poor operability, since it is also conducted at high temperatures, and the treatment of waste liquid is also troublesome. Whether treatment is conducted by means of sulfuric acid and hydrogen peroxide or by means of organic solvents, the peeling mechanism does not involve the peeling of the resist, but rather the dissolving of the resist. Since the resist on the substrate surfaces of the semiconductor and the like; which is applied on all surfaces to a depth of 1–2 μm, is completely dissolved, the degradation of the peeling agent is extremely severe.

The plasma treatment method has problems in that after treatment, contaminants contained in the resist, such as metals and microgranules and the like, remain on the wafer.

SUMMARY OF THE INVENTION

The present invention solves the problems in the conventional cleaning method and cleaning apparatus; it has as an object thereof to provide a cleaning method and cleaning apparatus in which an organic film such as a photoresist or the like is removed by peeling rather than being dissolved, at room temperatures, so that the cleaning treatment is completed in a very short period of time, the cleaning liquid does not degrade over a long period of time, and moreover, the cleaning efficiency is high, and almost no chemical vapors or water vapor are generated, so that the apparatus can be made small and simple.

The cleaning method of the present invention is such that, in a cleaning solution in which hydrofluoric acid or ammonium fluoride is mixed into an organic solvent diluted with pure water, an organic film such as a resist or the like deposited on a substrate is removed by applying ultrasound to the cleaning solution.

Furthermore, the cleaning method of the present invention is such that, in a cleaning solution in which halogenated alkali metal salts are mixed into an organic solvent which is diluted with pure water, organic films such as resists or the like deposited on a substrate are removed by means of the application of ultrasound to the cleaning solution.

During cleaning, it is preferable that the substrate be lifted out of the cleaning liquid and lowered back into the cleaning liquid. Furthermore, it is preferable that the substrate be caused to oscillate and/or that a jet shower be provided within the liquid at the substrate. By means of this, the cleaning effect will be further increased, the uniformity of cleaning will be improved, and the cleaning time can be shortened.

Furthermore, by means of placing an inner tank filled with the cleaning liquid within an outer tank filled with a liquid, and disposing an ultrasonic oscillator on the outer tank, the intermittent application of ultrasound to the cleaning liquid is carried out. By means of this, it is possible to maintain the temperature of the cleaning liquid so as to be at near room temperature, and to maintain strong cleaning effects.

Furthermore, the cleaning method of the present invention is such that, while applying ultrasound to a cleaning liquid in which hydrofluoric acid or ammonium fluoride is mixed into an organic solvent diluted with pure water, the cleaning liquid is supplied to the substrate, and the organic film deposited on the substrate is removed.

Additionally, the cleaning method of the present invention is such that, while applying ultrasound to a cleaning liquid in which halogenated alkali metal salts are mixed into an organic solvent diluted with pure water, the cleaning liquid is supplied to a substrate, and the organic film deposited on the substrate is removed.

Furthermore, in the cleaning method of the present invention, while applying ultrasound to a cleaning liquid in which hydrofluoric acid or ammonium fluoride is mixed into an organic solvent diluted with pure water, the cleaning liquid is supplied to the rear surface of a substrate after the application of a photoresist, and the organic film deposited on the substrate rear surface is removed.

Furthermore, in the cleaning method of the present invention, while applying ultrasound to a cleaning liquid in which halogenated alkali metal salts are mixed into an organic solvent diluted with pure water, the cleaning liquid is supplied to the rear surface of a substrate after the application of a photoresist thereto, and an organic film deposited on the substrate rear surface is removed.

Here, it is preferable that the substrate be rotated. Furthermore, it is preferable that the atmosphere around the substrate be at 50 Torr or less.

In the present invention, the temperature of the cleaning liquid is within a range of 15°–40° C. Cleaning at room temperatures becomes possible, so that an apparatus may be realized that has cleaning effects, good operability, and is reduced in size and simplified.

Isopropyl alcohol is preferably employed as the organic solvent, and the concentration thereof should preferably be within a range of 4–90 wt %. This range further increases the effectiveness of cleaning.

Furthermore, the concentration of the hydrofluoric acid should preferably be within a range of 0.01–0.5 wt %. The ammonium fluoride concentration should preferably be within a range of 0.6–6.5 wt %.

Furthermore, the concentration of the potassium fluoride is preferably within a range of 0.01–10 wt %, and the concentration of the potassium chloride is preferably within a range of 0.05–10 wt %.

In the cleaning method of the present invention, it is preferable that treatment using a solvent be conducted as a pretreatment prior to the treatment for removal of the organic film by means of the cleaning liquid. Isopropyl alcohol and dimethylsulfoxide are preferably employed as such solvents; this is preferably conducted in an atmosphere having a moisture concentration of 1 ppm or less.

The frequency of the ultrasound is preferably within a range of 0.8–10 MHz.

The cleaning apparatus of the present invention is a cleaning apparatus which removes organic films on the surface of a substrate by immersing the substrate in a cleaning liquid and applying ultrasound thereto; it is provided with a cleaning tank in which the substrate is disposed, an ultrasonic oscillator which is disposed on the cleaning tank, a filter for removing the peeled-off organic film from the cleaning liquid, and a piping system for circulating the cleaning liquid between the cleaning tank and the filter; this apparatus employs a cleaning liquid in which hydrofluoric acid or ammonium floride or halogenated alkali metal salts are mixed into an organic solvent diluted with pure water.

The cleaning tank comprises an inner tank filled with cleaning liquid and an outer tank, which is filled with a liquid which serves to transmit ultrasound; the ultrasonic oscillator is attached to the outer tank.

Furthermore, another cleaning apparatus of the cleaning invention removes organic films on a substrate surface by supplying a cleaning liquid, to which ultrasound is applied, to a rotating substrate; this apparatus employs a cleaning liquid in which hydrofluoric acid or ammonium fluoride or halogenated alkali metal salts are mixed into an organic solvent diluted with pure water, and the apparatus has a piping system for recovering cleaning liquid supplied to the substrate, and again supplying this cleaning liquid to the substrate via a filter which serves to remove peeled-off organic film from the cleaning liquid. Here, it is preferable that the interior of the cleaning apparatus be at 50 Torr or less, The cleaning liquid is supplied to the substrate via a nozzle, and the nozzle has at least one diffuser; it is preferable that the size of this diffuser be larger than the wavelength of the ultrasound within the cleaning liquid.

Furthermore, the nozzle may have a plurality of diffusers arranged in a line.

It is preferable that the filter employed be a multistage filter in which filters having differing particle diameters which can be removed are arranged so that the particle diameters become progressively smaller. Furthermore, it is preferable that two or more such systems be provided.

The cleaning method and cleaning apparatus of the present invention are particularly preferably applied to the peeling and removal of photoresist.

| (Description of the References) | |
|---|---|
| 101 | inner tank, |
| 102 | cleaning liquid, |
| 103 | outer tank, |
| 104 | liquid, |
| 105 | ultrasonic oscillator, |
| 201 | substrate, |
| 202 | rotation apparatus, |
| 203 | cleaning liquid supply nozzle, |
| 204 | cleaning liquid supply apparatus, |
| 205 | ultrasonic oscillator, |
| 206 | rotating table, |
| 301 | substrate, |
| 302 | cleaning liquid shower, |
| 303 | cleaning liquid supply apparatus, |
| 304 | ultrasonic oscillator, |
| 501 | inner tank of the cleaning tank, |
| 502 | cleaning liquid, |
| 503 | outer tank, |
| 504 | pure water, |
| 505 | ultrasonic oscillator, |
| 506 | cleaning liquid storage tank, |
| 507, 513 | pumps, |
| 508, 509 | film deaerating apparatus, |
| 510 | heat exchanger, |
| 511, 512 | level sensors, |
| 514 | filter 514, |
| 601 | cleaning liquid storage tank, |
| 602, 608 | pumps, |
| 603 | film deaerating apparatus, |
| 604 | rotating platform, |
| 605 | cleaning nozzle, |
| 606 | ultrasonic oscillator, |
| 607 | recovery tank, |
| 609 | filter. |

DETAILED DESCRIPTION OF THE INVENTION

An executed form of the present invention will be explained using FIG. 1.

Figure 1:
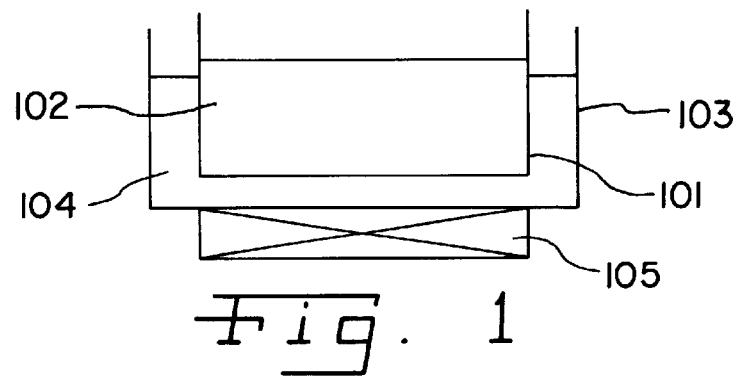
FIG. 1 is a conceptual diagram showing an example of a cleaning apparatus for executing the cleaning method of the present invention.

FIG. 1 shows an example of a cleaning tank which can be used for batch processing in order to employ the cleaning method of the present invention.

In FIG. 1, reference 101 indicates an inner tank which is filled with a cleaning liquid 102 comprising pure water, isopropyl alcohol, and hydrofluoric acid, ammonium fluoride, or potassium fluoride. Reference 103 indicates an outer tank having an ultrasonic oscillator 105 attached to the outer wall thereof; the interior thereof is filled with a liquid 104 such as pure water or the like.

A substrate is immersed in cleaning liquid 102, and voltage is applied to ultrasonic oscillator 105. The ultrasound which is produced by the oscillator is applied to the cleaning liquid 102 via outer tank 103, liquid 104, and inner tank 101, and as a result of synergistic effects between the ultrasound and the cleaning liquid components, the photoresist on the substrate can be peeled off and removed extremely effectively at temperatures approximating room temperature.

The detailed reasons for the attainment of a high cleaning effect are at present not completely clear; however, they are thought to be as follows, First, the isopropyl alcohol (IPA) and hydrofluoric acid and ammonium fluoride, or potassium fluoride, penetrate to the interior of the resist, and in particular, to the interface between the resist and the substrate, and cause slight dissolving and swelling of the resist, greatly reducing the adhesive forces between the resist and the surface, and as a result, the resist is peeled off by means of ultrasound. Furthermore, the chemical bonds between the resist and the surface are severed by radicals (H radicals and OR radicals) produced within the cleaning fluid by the ultrasound, and resist peeling is thus promoted. By means of using isopropyl alcohol, the ammonium fluoride or potassium fluoride, or the hydrofluoric acid, is caused to penetrate to the interface between the substrate and the resist and causes swelling of the resist. Additionally, the ammonium fluoride or potassium fluoride penetrates together with the isopropyl alcohol into the interface, causing slight etching of the substrate, thus pulling the resist away from the base layer, so that the resist may be peeled off by means of the ultrasound.

Figure 8:
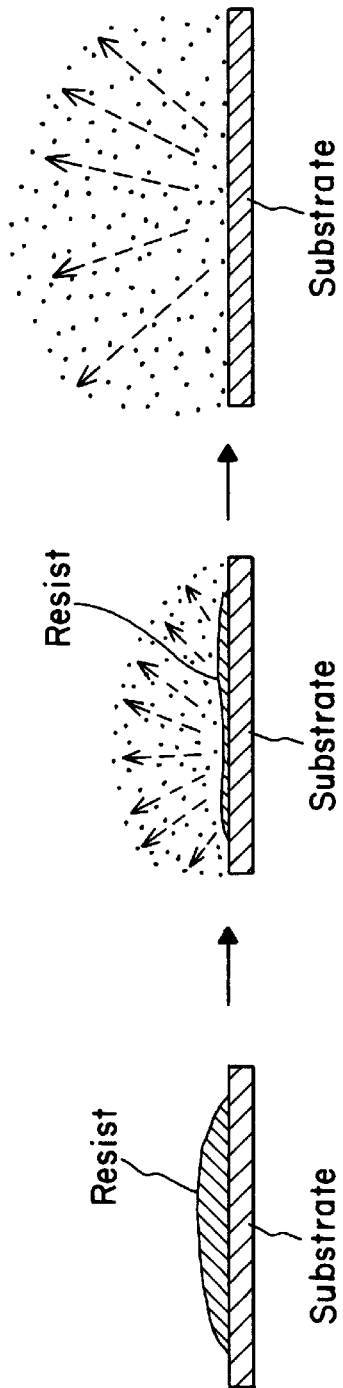
FIG. 8 shows the outlines of the process of dissolving and removal of a conventional method.
Figure 9:
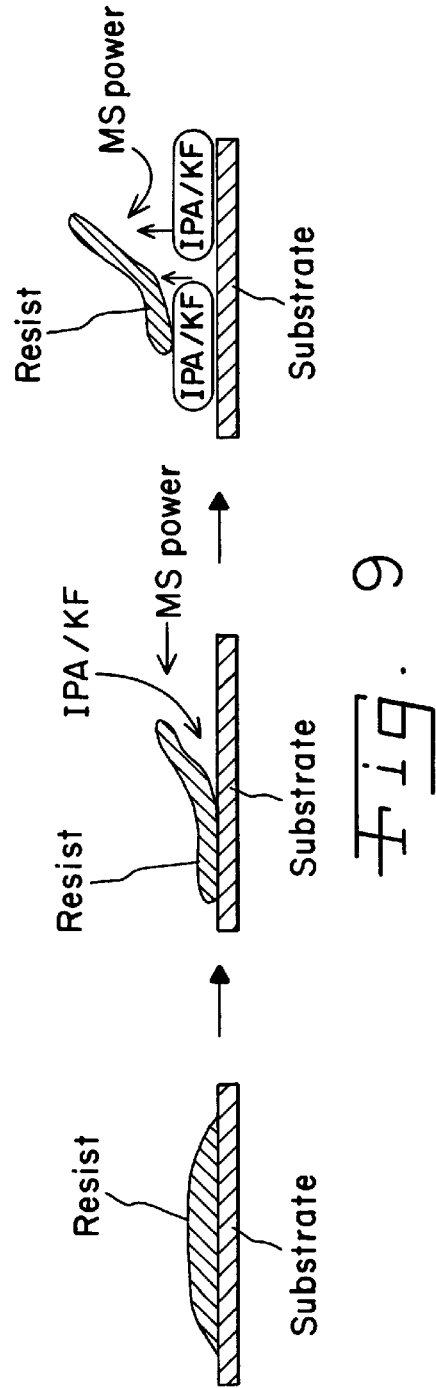
FIG. 9 shows the outlines of the process of peeling and removal of the present invention.

Here, in order to explain the effects of peeling and removal of the present invention, the outlines of the process of dissolving and removal in a conventional method are shown in FIG. 8, while the outlines of the process of peeling and removal of the present invention are shown in FIG. 9.

There are cases in which, in order to improve the adhesion of the resist film to the substrate, a hydrophobic treatment (for example, HMDS (hexamethyl disilazane) treatment) is conducted on the substrate surface prior to formation of the resist film; however, in such cases as well, the resist can be effectively removed by means of the cleaning method of the present invention. By means of mixing isopropyl alcohol with ammonium fluoride or potassium fluoride or hydrofluoric acid, the surface tension is reduced, and the wettability of the HMDS-treated surface is improved, and as a result, the cleaning liquid penetrates to the interface between the resist and HMDS-treated surface, and the resist is peeled off. Alternatively, the HMDS-treated surface can be thought of as being slightly etched or dissolved.

It is preferable that the temperature of the cleaning liquid be within a range of 15°–40° C., and a range of 20°–35° C. is further preferable. If the temperature is in excess of 40° C., the resist will strongly adhere to the substrate, so that it becomes difficult to remove, while if the temperature is too low the surface tension of the cleaning liquid will increase, and the liquid will have difficulty penetrating to the interface between the resist and substrate, so that removal will be difficult.

The extent of the increase in the temperature of the cleaning liquid is dependent on conditions such as the power of the ultrasound, the frequency of the ultrasound, and the period of time during which ultrasound is applied, and the like. In order to maintain the temperature within the prescribed range there are various methods which are possible; for example, the liquid 104 in FIG. 1 may be circulated between a constant temperature tank and a cooling coil or the like. Alternatively, the ultrasound may be applied intermittently, and the increase in temperature thus suppressed.

The frequency of the ultrasound is preferably within a range of 0.8–10 MHz. At frequencies which are lower than 0.8 MHz, cavitation is likely to be generated, and there are cases in which the shape of the semiconductor elements breakes down. At frequencies of 0.8 MHz or more, cavitation does not occur, and furthermore, as the frequency increases, the sound pressure (degree of acceleration in the vibration) increases, and the photoresist removal effect is further increased; however, when a frequency of 10 MHz is exceeded, the increase in temperature becomes severe, and an apparatus having a large cooling ability becomes necessary, so that the above frequency range is preferable.

Furthermore, because there is a high resist removal activity in the vicinity of the liquid surface, it is preferable that the raising and lowering of the substrate be conducted in the liquid. By means of this, the resist removal effects can be further increased. The reason for this is thought to be that, as a result of obtaining a high cleaning liquid flow speed at the liquid surface as a result of ultrasound, and as a result of the formation of an active component at the density in the vicinity of the interface by means of a composite wave (standing wave pattern) of rectilinear waves and reflected waves at the liquid surface, the cleaning effect is increased; the resist peeling is thus accelerated by moving the substrate up and down at the surface.

Furthermore, by oscillating the substrate horizontally, ultrasound is uniformly applied, and it is possible to further increase the cleaning effect. Additionally, by disposing one to two or more nozzles in the cleaning liquid and spraying the cleaning liquid onto the surface of the substrate, it is possible to further increase the cleaning effect.

In the present invention, the concentration of the hydrofluoric acid and ammonium fluoride or potassium fluoride differs depending on the temperature of the cleaning liquid; however, at low concentrations, the cleaning effect is low, and when high concentrations are reached the resist tends to become bonded; so that removal becomes impossible. As a result of the above, the preferred concentration of hydrofluoric acid is within a range of 0.01–1 wt % and more preferably within a range of 0.1–0.5 wt %. Furthermore, the preferable concentration of ammonium fluoride is within a range of 0.6–6.5 wt %.

Furthermore, it is of course the case in the present invention that it is permissible to add both hydrofluoric acid and ammonium fluoride. In this case; the concentrations are such that hydrofluoric acid is preferably at a concentration within a range of 0.01–0.05 wt %, while ammonium fluoride is preferably within a concentration of 0.05–0.5 wt %.

Furthermore, potassium fluoride, potassium chloride, or the like may be employed as the halogenated alkali metal salts in the present invention.

The amount of potassium fluoride blended is preferably within a range of 0.005–10 wt %, and more preferably within a range of 0.01–10 wt %. Furthermore, the amount of potassium chloride blended is preferably within a range of 0.05–10 wt %.

In the cleaning method described above, isopropyl alcohol was employed; however, this is not necessarily so limited, and alcohols such as, for example, methyl alcohol, ethyl alcohol, 2-ethoxy ethanol, and the like, as well as other organic solvents such as acetone, ethylmethylketone, and the like, may be employed. However, isopropyl alcohol is most preferable from the point of view of the cleaning effects as well as the stability and handling characteristics.

If the concentration of the organic solvent is low, the resist peeling effect is weak, while when the concentration is high, gas bubbles will be produced by the ultrasound, and the ultrasound effect will be reduced. Accordingly, the appropriate concentration is determined by the inputted power, the type and concentration of the fluoride or halogenated alkali metal salt which is blended in, and the like; however, strong resist removal effects can be obtained at concentrations of within a range of 4–90 wt %.

Furthermore, in the present invention, by means of providing scratches at the resist surface, it is possible to further increase the resist removal effect. Methods for the provision of such scratches include, for example, a method in which tracing is conducted with a tiny needle, a method in which tiny ice crystals or the like are sprayed (the ice scrub method), treatment with ozonated water (5–20 ppm), or a method in which the resist surface is roughened by the application of ultrasound to ozonated water, or the like. It is desirable that the scratches formed be as deep as possible without causing damage to the substrate surface.

Furthermore, in place of the formation of scratches such as those described above, it is possible to increase the resist removal effect by means of the formation of a pattern.

The pure water which is used in the present invention varies depending on the type of substrate which is to be cleaned; however, impurities should be suppressed in the water, and in the case in which the removal of a photoresist from a semiconductor substrate is conducted, the number of contaminant particles having a diameter of 0.05 $\mu$m or more should be on the level of a few per cc or less, and the resistivity should be 18 M$\Omega$. cm or more, and the total organic carbon and silica values should be 1 ppb or less.

It is preferable that the fluid 104 in FIG. 1, comprising pure water or the like, be deaerated in order to efficiently transmit ultrasound. Furthermore, it is preferable that the cleaning liquid be deaerated in the same manner. In the case of a frequency of 2 MHz, it is preferable that the gas component be 2.5 ppm or less, and a level of 1.5 ppm or less is further preferable. When the frequency is greater than 2 MHz, the gas component is preferably 1 ppm or less, and a level of 100 ppb or less is more preferable.

In the present invention, the double tank structure shown in FIG. 1 is not absolutely necessary; a single tank structure may be employed in which an oscillator is attached to the outer wall, and ultrasound is directly applied to the cleaning liquid, and in this case, as described above, the temperature may be maintained at a constant value by intermittent application of ultrasound, or by circulating the cleaning liquid to a constant temperature tank. The number of oscillators is not necessarily limited to one; such oscillators may be provided on the side walls, floor, and upper surface of the tank. Furthermore, it is necessary that the resist present in the cleaning liquid be removed by filters during the circulation process.

Next, another example of the cleaning method of the present invention will be explained using FIGS. 2 and 3.

Figure 2:
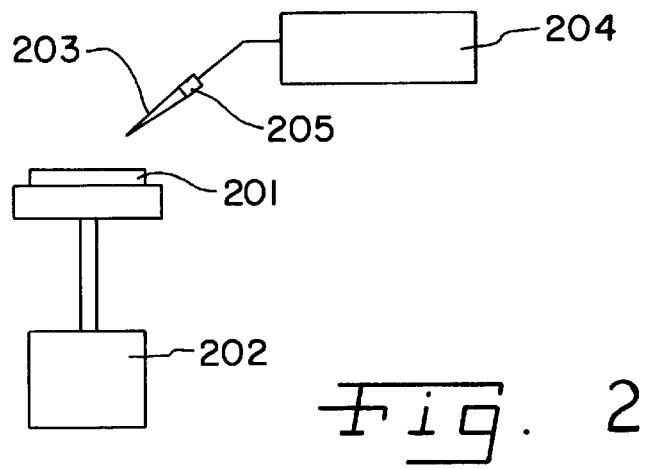
FIG. 2 is a conceptual diagram showing an example of a cleaning apparatus for executing the cleaning method in accordance with the present invention.

In FIG. 2, reference 201 indicates a substrate, reference 202 indicates a rotation apparatus, reference 203 indicates a cleaning liquid supply nozzle, reference 204 indicates a cleaning liquid supply apparatus, and reference 205 indicates an ultrasonic oscillator. Reference 206 indicates a rotating table on which the substrate is placed. By means of this, the cleaning liquid to which ultrasound is applied is sprayed onto the surface of the rotating substrate, and thereby, by means of synergistic effects with the action of centrifugal force, the resist is efficiently removed. Here, it is preferable that the angle between the nozzle and the substrate be approximately 45°. The diffuser of the nozzle may be circular, and may be made to move back and forth in the radial direction of the substrate; alternatively, a line-shaped nozzle having narrow diffusers in the circumferential direction, which has the form of a line in the radial direction of the substrate, may be employed. The size of the nozzle diffusers is preferably larger than the wave length of the ultrasound in the cleaning liquid, in order to permit the efficient passage of the ultrasound. For example, in the case in which ultrasound of 0.95 MHz is used, the size of the diffuser is preferably 1.5 mm or greater and 2 mm or less.

Since the resist removal in the present invention is accomplished not by means of the dissolving of the resist, as in conventional methods, but rather by the peeling of the resist, the method shown in FIG. 2 is especially preferable in order to suppress the redeposition of the peeled-off resist film onto the substrate. If a plurality of diffusers are provided, the peeling off of the resist can be accomplished at higher speeds.

Furthermore, after the resist has been applied while rotating the substrate, there are cases in which the resist drips from the front surface to the rear surface. This is then subjected to prebaking (at approximately 90° C.). Here, by means of cleaning the rear surfaces of the substrate using extended cleaning with a mixture of hydrofluoric acid, ammonium fluoride or halogenated alkali metal salts in an organic solvent in order to remove the resist adhering to the rear surface, it is possible to reduce the cross-contamination effect in the substrate conveyance system. With regard to the cleaning, a cleaning nozzle may be disposed at the lower part of the resist application apparatus so as to be vertical or at an angle to the rotating platform.

Figure 3:
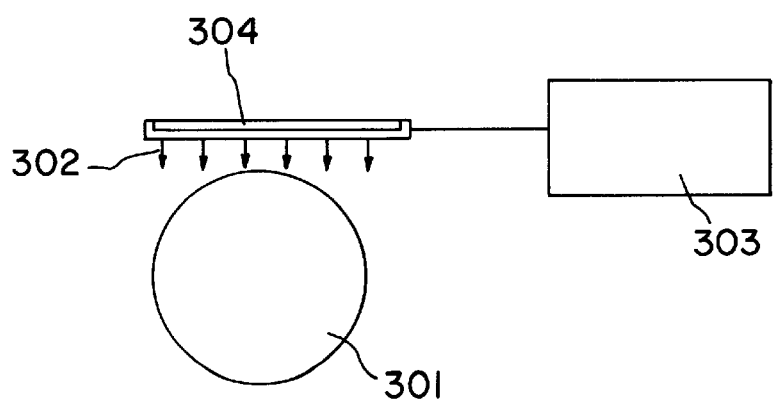
FIG. 3 is a conceptual diagram showing an example of a cleaning apparatus for executing the cleaning method of the present invention.

FIG. 3 shows a method in which cleaning liquid, to which ultrasound is applied, is supplied to the substrate in the form of a shower; as a result of the physical forces from above, the resist is peeled off from the top to the bottom. Additionally, the substrate may be disposed so as to be parallel to the shower, and in this case, it is preferable that the substrate be moved so that cleaning liquid is supplied uniformly to the entire substrate. In order to alter the direction of the shower, it is effective if the diffuser of the shower is caused to move into a rotating cycle within a range of, for example, ±15°.

In FIG. 3, reference 301 indicates a substrate, reference 302 indicates a cleaning liquid shower, 303 indicates a cleaning liquid supply apparatus, and reference 304 indicates an ultrasonic oscillator.

In the present invention, by means of conducting pretreatment by means of organic solvent prior to the cleaning method described above, the resist peeling effect can be further increased.

That is to say, the washing process may be divided into two processes: in the first process, a substrate having an organic film deposited thereon is immersed in an organic solvent, and then, in the second process, as described above, resist removal is conducted while applying ultrasound and using a cleaning liquid comprising an organic solvent, pure water, and hydrofluoric acid or ammonium fluoride or a hydrogenated alkali metal salt.

Here, isopropyl alcohol (IPA) and dimethyl sulfoxide (DMSO) may be employed as the organic solvent in the first process; 100% IPA is particularly preferable. Furthermore, the treatment atmosphere of the first process should be a closed atmosphere in which moisture is present at 1 ppm or less. The first process is not limited to immersion; a shower method or spray method may also be employed.

The present invention is optimal for the removal of various types of photoresist; extremely strong removal effects can be obtained even with respect to TSMR-8900 (produced by Tokyo Ooka Kogyo) which is very heat resistant and the removal of which presents difficulties. The present invention is effective against i-line resist, resist for excimer lasers, and electron beam resist.

Furthermore, the present invention is not limited to photoresists; it may be applied to the removal of various high molecular organic films such as pigments, adhesives, or the like, of films such as machine oil or the like (which are baked on and contain high molecular components), and of surfactants or dyes.

Figure 5:
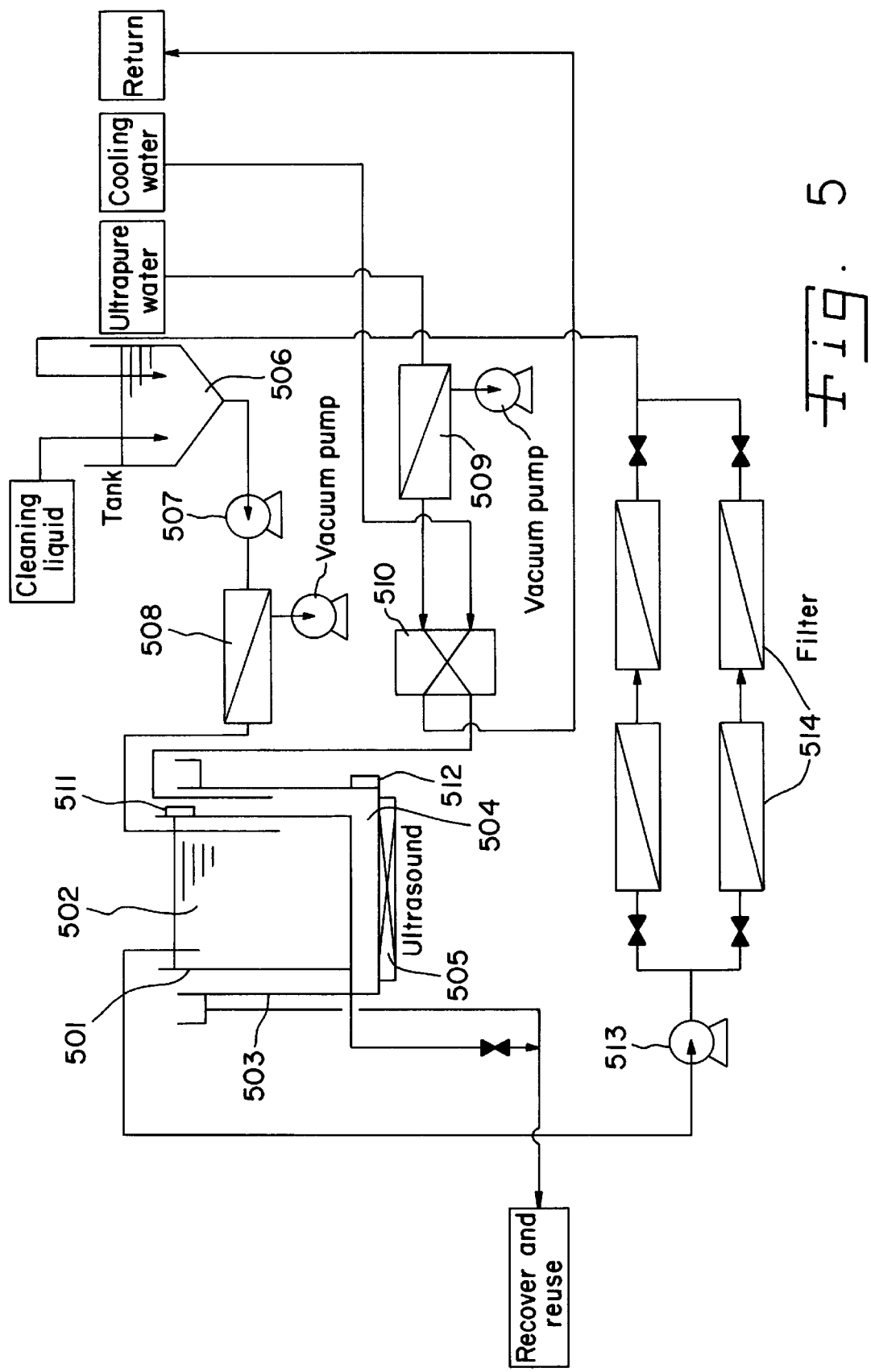
FIG. 5 is a conceptual diagram showing an example of a cleaning apparatus of the present invention.
Figure 6:
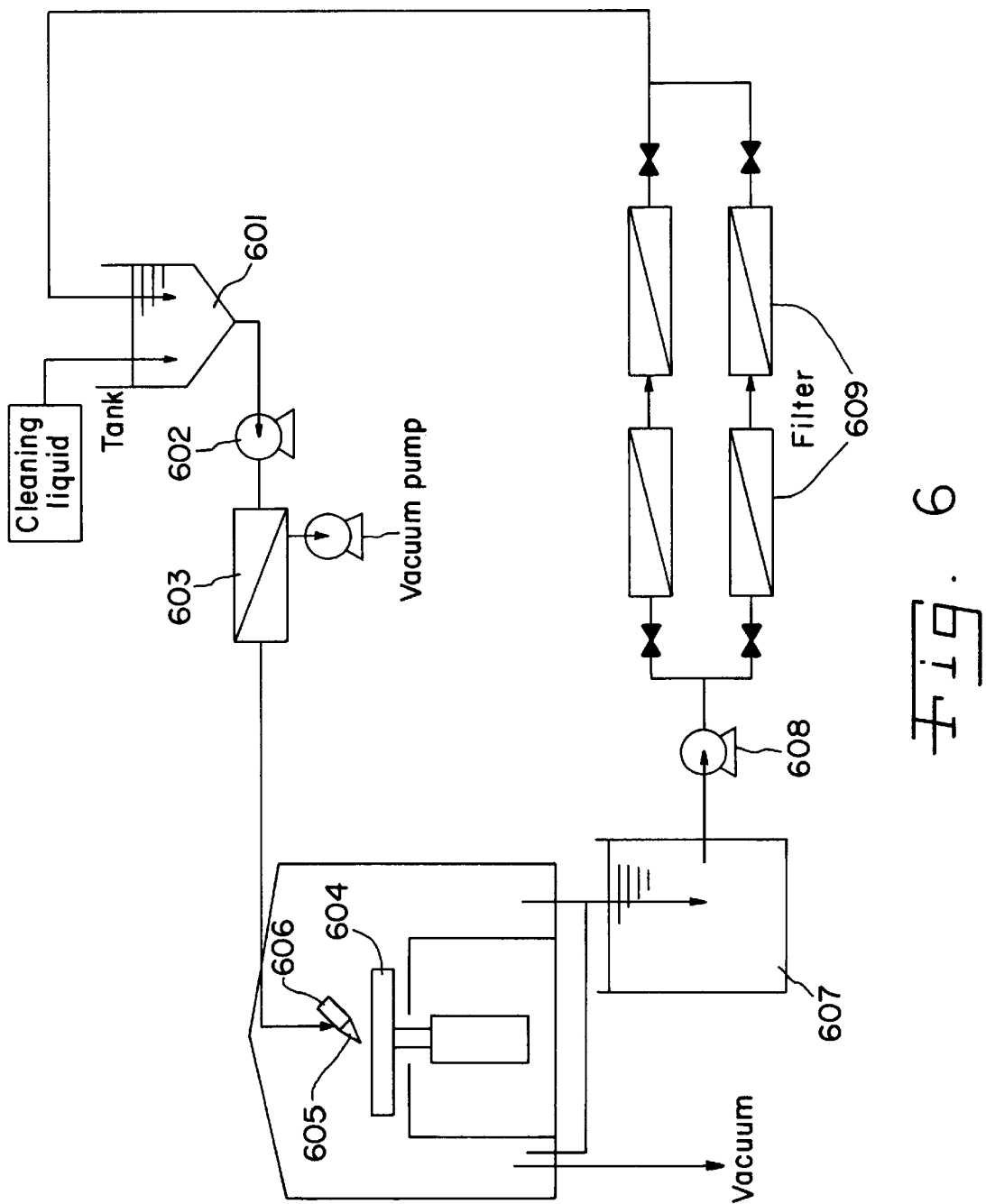
FIG. 6 is a conceptual diagram showing another example of a cleaning apparatus of the present invention.

Next, a cleaning apparatus of the present invention which is capable of the continous resist peeling treatment of substrates is shown in FIGS. 5 and 6, and using these, a cleaning method will be explained.

FIG. 5 shows a cleaning apparatus which conducts resist peeling and removal using an immersion method. First, the cleaning liquid is prepared, and this is supplied to cleaning liquid storage tank 506. The cleaning liquid is pressurized by pump 507 and is sent to film deaerating apparatus 508; after the removal of dissolved gases contained in the cleaning liquid, this is sent to inner tank 501 of the cleaning tank. The pure water is degassed by film deaerating apparatus 509, is then cooled by heat exchanger 510, and is sent to the outer tank 503 of the cleaning tank; it is possible to recover and use this pure water which is used for the purposes of cooling.

Next, the wafer having a resist deposited thereon is immersed in inner tank 501, ultrasound is applied by ultrasonic oscillator 505, and resist peeling is conducted.

The level sensor 511 which is attached to inner tank 501 serves to control the liquid level; the level sensor 512 which is attached to the outer tank serves to prevent the misuse of the ultrasonic oscillator.

The cleaning liquid is returned to tank 506 via filter 514 by means of pump 513. The resist peeled from the wafer is removed by filter 514. In the example shown in the figure, two 2-stage filters are aligned in parallel. When the efficiency of removal declines, the filters are changed. A filter which removes resist particles of 0.5 $\mu$m or more, for example, is employed as the prestage filter, and a filter which removes particles having a size of 0.05 $\mu$m or more may be used as the post stage filter.

FIG. 6 shows a cleaning apparatus which conducts resist peeling and removal by means of cleaning liquid spray. First, the cleaning liquid is prepared and supplied to cleaning liquid storage tank 601. A wafer is conveyed to a rotating platform 604, and the cleaning atmosphere is depressurized to approximately 50 Torr. The cleaning liquid in tank 601 is pressurized by pump 602 and sent to film deaerating apparatus 603, and the dissolved gases present in the cleaning liquid are removed.

The deaerated cleaning liquid is sent to cleaning nozzle 605, ultrasound is applied by means of ultrasonic oscillator 606, and the liquid is supplied to the wafer. When the cleaning liquid is supplied, rotating platform 604 begins simultaneously to rotate, and peeling is conducted.

The cleaning liquid is stored in recovery tank 607, is pressurized by pump 608, and after the removal of the peeled-off resist by filter 609, the liquid is returned to tank 601, and reused.

(Preferred Embodiments)

Hereinbelow, the present invention will be explained concretely on the basis of preferred embodiments; however, it is of course the case that the present invention is in no way limited to the embodiments described.

(Embodiment 1)

Using the cleaning apparatus of FIG. 1, the relationship between the hydrofluoric acid in the cleaning liquid and the time required for resist removal was investigated.

In the present embodiment, a 33 mm$\phi$ silicon plate having a resist formed thereon by means of the process described below was employed as a substrate.

(Resist Formation Process)

(1) Substrate prebake: 150° C., 5 minutes
(2) HMDS (hexamethyl disilazane) application: 1 minute 30 seconds
(3) resist (TSMR-8900) application; 800 rpm, 2 seconds, 3000 rpm, 40 seconds (film thickness: 1.0–1.3 $\mu$m)
(4) bake: 90° C., 1 minute 30 seconds
(5) ultrapure water rinse: 1 minute
(6) post bake: 130° C., 5 minutes The cleaning liquid was prepared by adding 100% isopropyl alcohol (IPA) to ultrapure water (at this time, the IPA concentration was adjusted so as to be 20 wt % in correspondence with the variable amount of HF), and next, the HF concentration was adjusted by the addition of 50 wt % hydrofluoric acid, and ultrasound was applied. Furthermore, the temperature of the cleaning liquid was maintained at 25° C. by means of circulating the pure water 104 to a constant temperature tank. The frequency of the ultrasound which was used was 0.95 MHz.

The treatment time has values representing a conversion, with respect to a resist of a thickness of 1 $\mu$m, of the time required for the residue to completely disappear when an observation of the resist on the substrate was made by light microscopy, The results are shown in Table 1.

TABLE 1

| HF Concentration [wt %] | Treatment Time (sec) |
| --- | --- |
| 0 | 3600 |
| 0.01 | 1800 |
| 0.05 | 820 |
| 0.1 | 480 |
| 0.5 | 160 |
| 1.0 | 1800 |
| 3.0 | Difficult to remove |

As is clear from Table 1, the resist can be peeled off if ultrasound is applied to IPA and ultrapure water alone; however, when hydrofluoric acid is added, the treatment is greatly shortened, and in particular, at concentration ranges of 0.01–1.0 wt %, and more specifically, at a range of 0.05–0.5 wt %, the peeling effect is improved.

(Embodiment 2)

Everything was done in the same manner as in embodiment 1, with the exception that in place of the hydrofluoric acid, which etches $SiO_2$, ammonium fluoride, which does not etch the $SiO_2$ film, was employed, and the cleaning effects resulting from ammonium fluoride concentrations in the cleaning liquid was investigated. The cleaning liquid was prepared by adding 100% IPA to ultrapure water (at this time, the concentration of IPA was adjusted in correspondence with the amount of ammonium fluoride so as to be 20 wt %), and 30 wt % ammonium fluoride was added to produce various ammonium fluoride concentrations. The results are shown in Table 2.

Furthermore, as a comparative example, conventional cleaning was carried out at a temperature of 130° C. using sulfuric acid and hydrogen peroxide. The results thereof are shown in Table 3.

TABLE 2

| HF Concentration [wt %] | Treatment Time (sec) |
|---|---|
| 0.6 | 600 |
| 1.2 | 300 |
| 2.4 | 180 |
| 4.4 | 100 |
| 4.8 | 80 |
| 5.0 | 100 |
| 5.6 | 100 |
| 6.0 | 200 |
| 6.5 | 400 |
| 7.0 | Impossible to remove |

TABLE 3

| Sulfuric acid · hydrogen peroxide*) | Treatment Time (sec) |
|---|---|
| 4:1 | 600 |
| 3:1 | 800 |
| 4:2 | 650 |

*)Volumetric ratio between 98 wt % $H_2SO_4$ and 30 wt % $H_2O_2$

In the same manner as in the case of hydrofluoric acid, when the concentration increases, the effects increase, and particularly strong peeling effects are observed at concentrations within a range of 0.6–6.5 wt %. In spite of the fact that the cleaning of the present embodiment can be conducted at room temperature, the present embodiment exhibits superior removing ability even in comparison with treatment with sulfuric acid and hydrogen peroxide, which is required in high temperature treatment. This is thought to be the case because, in contrast to removal by sulfuric acid and hydrogen peroxide, in which removal is conducted by means of dissolving, the removal of the present invention in removal by peeling.

(Embodiment 3)

Experiments were conducted which were similar to those of embodiment 2, wherein the ammonium fluoride concentration was set at 5 wt %, and cleaning was conducted at various temperatures; it was determined that cleaning was best at temperatures within a range of 15°–40° C., and furthermore, the cleaning effect precipitously declined at temperatures in excess of 40° C.

When the temperature was in excess of 40° C., the resist dissolved and adhered strongly to the substrate, so that removal was difficult.

(Embodiment 4)

After forming a resist film in the sa manner as in embodiment 1, As ion implantation into the resist film was conducted and the resist peeling effects were investigated under various cleaning conditions. The results thereof are shown in Table 4.

TABLE 4

| Cleaning Conditions | Treatment Time (min) |
|---|---|
| IPA/$NH_4F$/MS/no pattern | 60 |
| IPA/$NH_4F$/MS/scratches in resist surface | 15 |

TABLE 4-continued

| Cleaning Conditions | Treatment Time (min) |
|---|---|
| IPA/$NH_4F$/MS/patterned resist surface | 5 |
| $H_2SO_4$/$H_2O_2$/no pattern | 120 |
| $H_2SO_4$/$H_2O_2$/scratches in resist surface | 35 |
| $H_2SO_4$/$H_2O_2$/patterned resist surface | 13 |

Ion implantation amount: $1\times10^{15}$ ion/$cm^2$

IPA: 30 wt %, $NH_4F$: 4.8 wt %,

MS: 0.95 MHz ultrasound, $H_2SO_4$: $H_2O_2$=4:1, scratches: produced by a diamond pen at intervals of 1 mm
pattern: a 0.3 µm wiring pattern was formed at 0.5 mm intervals As is clear from Table 4, the cleaning method of the present embodiment exhibits high removal efficiency even in comparison with the ion-implanted resist film. In particular, when scratches or patterns are formed in the resist film, the removal effects He improved. The removal speed by means of IPA/$NH_4F$/MS is much faster than that by means of sulfuric acid and hydrogen peroxide treatment.

(Embodiment 5)

In the present embodiment, explanations will be given with respect to experiments which determine the effects of oscillation and raising and lowering of the substrate.

During cleaning, the substrate was oscillated within the cleaning liquid at cycles of one second with an amplitude from left to right of approximately 50 mm, and after the passage of 30 seconds, the substrate was lifted at a rate of 1 mm per second while continuing oscillation. Resist was not observed on the surface of the raised substrate, so that this resist was completely removed (embodiment 5-1).

The cleaning effects were measured when, during cleaning, the substrate was raised and lowered a distance of 30 mm in 5 second cycles (embodiment 5-2). Furthermore, the cleaning effects were measured when, in addition to the upward and downward motion of embodiment 5-2, left and right oscillation of 50 mm was conducted at 1 second cycles (embodiment 5-3).

In the present embodiment, the conditions were identical to those of embodiment 2, with the exception that the concentration of the ammonium fluoride in the cleaning liquid was 4.8 wt %. The results are shown in Table 5.

TABLE 5

| | Treatment Time (sec) |
|---|---|
| Embodiment 2 | 80 |
| Embodiment 5-1 | less than 63 |
| Embodiment 5-2 | 40 |
| Embodiment 5-3 | 30 |

As shown in table 5, it was possible to increase the cleaning effect by the left and right oscillation and upward and downward motion of the substrate in the cleaning liquid.

( Embodiment 6)

Using the cleaning apparatus of FIG. 2, a 6 inch silicon wafer having a photoresist formed thereon in a manner identical to that of embodiment 1 was rotated at 3000 rpm, cleaning liquid having ultrasound (0.95 MHz) applied thereto was supplied to the wafer at a rate of 1 liter per minute, and the resist removal effects were determined; it was confirmed that the resist was removed in 30 seconds.

Additionally, using the cleaning apparatus of FIG. 3, the same silicon wafer was supplied with cleaning liquid in the form of a shower at a flow rate of 10 liters per minute, and the resist removal effects were determined; in this case, as well, it was confirmed that the resist was removed in 30 seconds.

(Embodiment 7)

In this embodiment, procedures which were followed which were identical to those of embodiment 1, with the exception that in place of the hydrofluoric acid, potassium fluoride or potassium chloride, which do not etch $SiO_2$ films, was employed, and the cleaning effects were determined. The preparation of the cleaning liquid was accomplished by adding 100% IPA to the ultrapure water (at this time, the IPA concentration was set at 20 wt % in correspondence with the amount of potassium fluoride employed), and then potassium fluoride was added to adjust the potassium fluoride concentration. Furthermore, preparation was identical in the case of potassium chloride. The results are shown in Tables 6 and 7.

TABLE 6

| KF Concentration (wt %) | Treatment Time (sec) |
|---|---|
| 0.05 | 450 |
| 0.5 | 300 |
| 1.0 | 160 |
| 2.0 | 140 |
| 3.3 | 110 |
| 3.9 | 110 |
| 4.5 | 70 |
| 8.0 | 70 |
| 10.0 | 65 |

| KCl Concentration (wt %) | Treatment Time (sec) |
|---|---|
| 0.5 | 450 |
| 1.0 | 450 |
| 2.0 | 180 |
| 3.0 | 160 |
| 4.0 | 120 |
| 4.5 | 80 |
| 8.0 | 80 |
| 10.0 | 75 |
| 10.5 | 500 |

Figure 4:
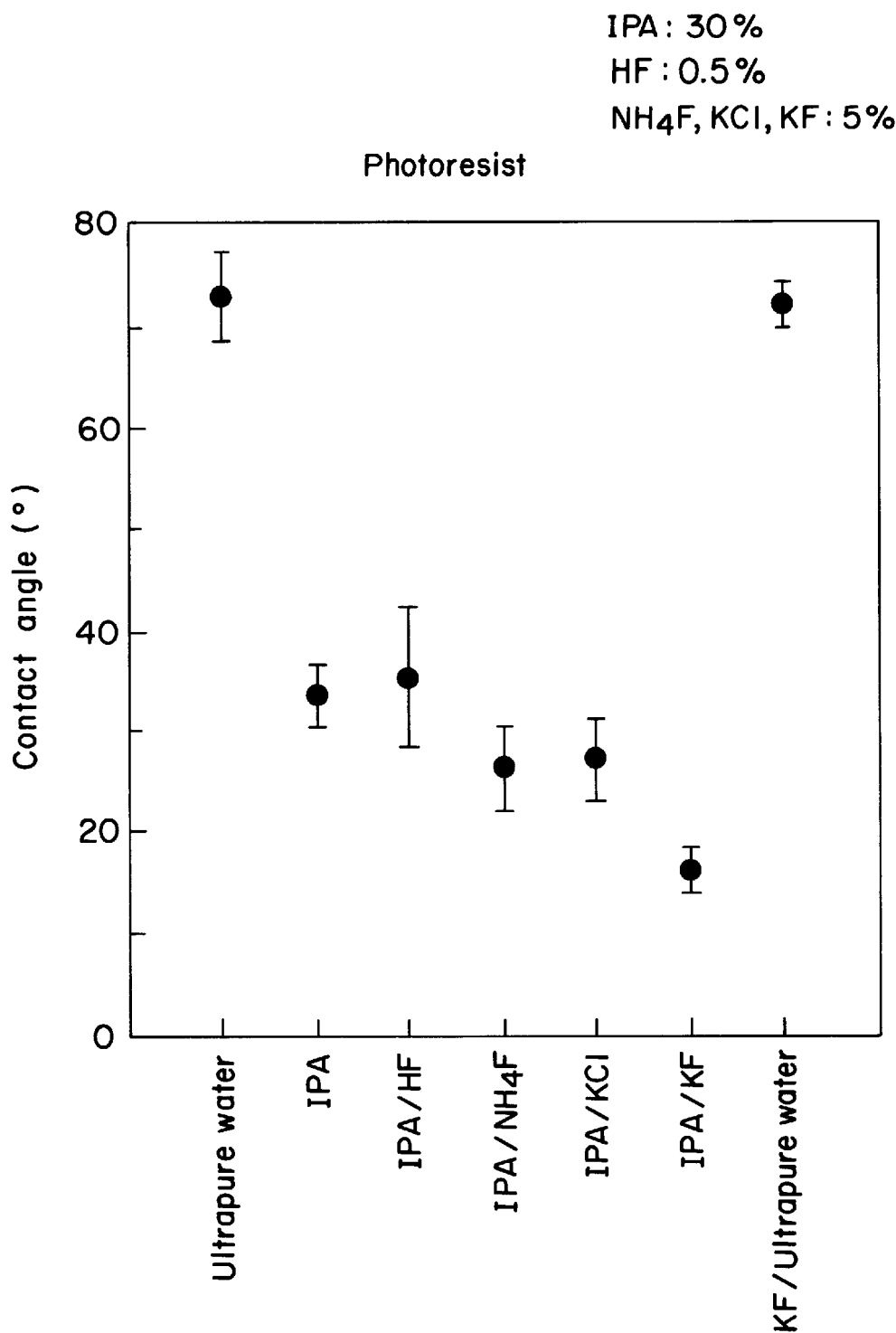
FIG. 4 is a graph showing the contact angle between various cleaning fluids and the resist.

As is clear from Tables 6 and 7, superior resist removal effects are obtained when either KF or KCl is used. In particular, it has been learned that potassium fluoride provides resist peeling effects which are superior to those obtained with hydrofluoric acid or ammonium fluoride. The reason for this is unclear; however, the contact angle of the contact fluids with respect to the resist shown in FIG. 4 is 28° in the case of IPA/KCl while it is lower, at 18°, for IPA/KF, so that the wettability of the resist is high. From this, a tendency for higher peeling effects at higher wettabilities can be seen.

(Embodiment 8)

The resist peeling effects were determined using various IPA concentrations in a mixed IPA/KF solution. The results thereof are shown in Table 8.

TABLE 8

| IPA (wt %) | KF Concentration (wt %) | Treatment Time (sec) |
|---|---|---|
| 54 | 1.9 | 40 |
| 65 | 0.3 | 35 |
| 76 | 0.15 | 30 |
| 88 | 0.05 | 20 |

(Embodiment 9)

In order to improve the adherence between the $SiO_2$ surface and the resist, a sillylating treatment is commonly conducted using HMDS; however, in the present embodiment, the relationship between the sillylating treatment agent and the peeling effect on the resist formed thereon was studied.

In addition to HMDS, DVTMDS was used as a sillylating agent, and the $SiO_2$ surface was made hydrophobic in a manner identical to that of embodiment 1, and the resist was formed thereon.

The resist removal was conducted under conditions such that the KF concentration in embodiment 7 was set at 4.5%. The results are shown in Table 9.

TABLE 9

| Sillylating Agent | Treatment Time (sec) |
|---|---|
| DVTMDS (1,3-divinyltetramethyl disilazane) | 60 |
| HMDS (hexethyl disilazane) | 70 |

As is shown in table 9, when sillylation is accomplished by means of DVTMDS, the resist peeling effect are stronger than in the case of HMDS.

This is thought to occur because the total number of C and Si molecules adhering to the $SiO_2$ surface is 4 in the case of HMDS (1 Si and 3 C) and 5 in the case of DVTMDS (1 Si, 4 C); as the number of atoms of Si and C increases, the ability of the cleaning liquid to penetrate to the interface is improved, and the resist is more easily peeled.

The contact angle of the cleaning liquid after sillylation treatment is 58° in the case of EMDS, and 60° in the case of DVTMDS.

(Embodiment 10)

Figure 7:
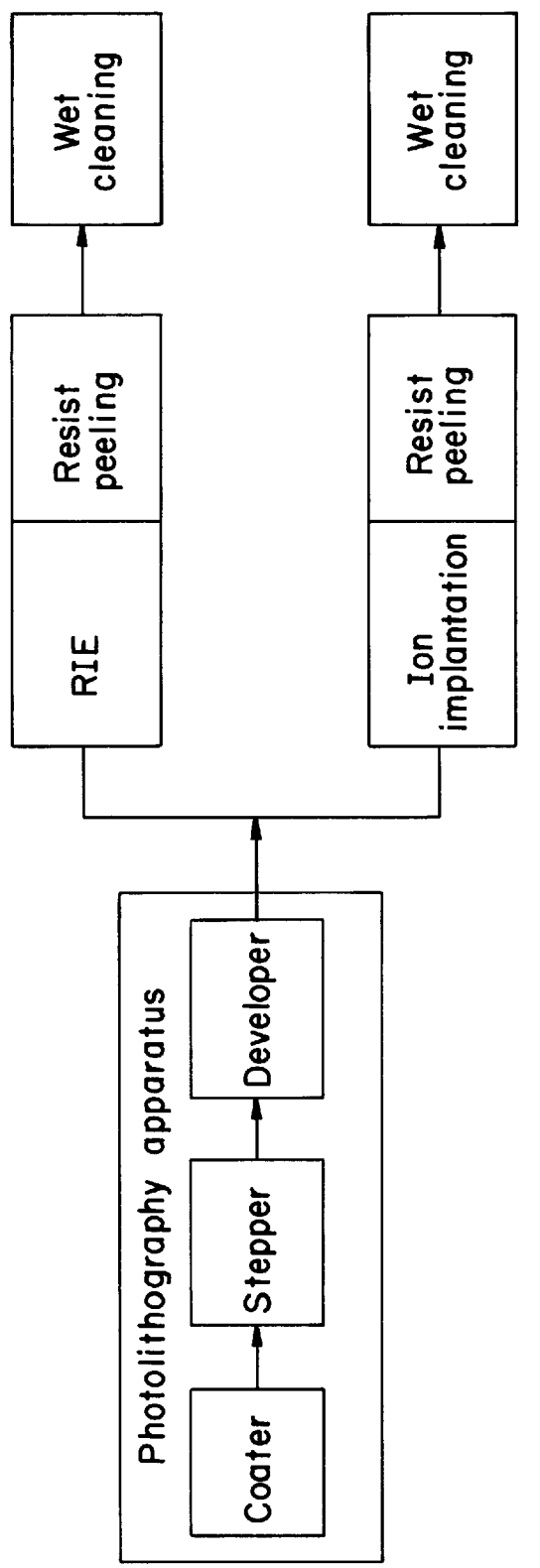
FIG. 7 shows a preferred arrangement of the cleaning apparatus of the present invention and other processing apparatuses.

It is very effective if the cleaning apparatus of the present invention, which applies megasonic ultrasound to IPA/KF, IPA/$NH_4$F, and the like, and peels a resist from a substrate surface, is disposed next to an ion implantation apparatus and reactive ion etching (RIE) apparatus, as shown in FIG. 7.

After ion implantation and the RIE process, wafers having resist thereon are contaminated with metals and the like; these contaminate the wafer conveyance path and the wafer conveyance box, and are sources of cross-contamination to other wafers. Accordingly, after the completion of ion implantation and the RIE process, if resist peeling by means of the present invention is conducted at room temperatures, and the wafers are sent to the wafer conveyance path and wafer conveyance box after room temperature wet washing and a drying treatment, the problem of cross-contamination can be solved.

(Embodiment 11)

A resist formed in accordance with the method of embodiment 1 was immersed, as a first process, in 100% IPA, and after this, as a second process, was treated in the manner of embodiment 7 using a mixed liquid of an aqueous solution of KF (1.9 wt %) and IPA (50 wt %), applying 0.95 MHz ultrasound, and the time required for the removal of the resist was determined. The results thereof are shown in Table 10.

TABLE 10

| First process (sec) | Second process (sec) | Total time (sec) |
| --- | --- | --- |
| 1850 | none | 1850 |
| 300* | none | 300 |
| 10 | 35 | 45 |
| 30 | 10 | 40 |
| none | 70 | 70 |

*:0.95 MHz ultra sound

As shown in Table 10, by means of combining a treatment process with 100% IPA, and treatment using a mixed solution of KF/IPA, the resist can be removed more efficiently. Since 100% IPA tends to absorb atmospheric moisture, it is preferable that the treatment atmosphere should be a gas atmosphere comprising nitrogen gas and oxygen gas, from which moisture has been removed.

In the present embodiment, the IPA treatment employed was in the form of an immersion method; however, showers or sprays may also be employed.

(Embodiment 12)

In the present embodiment, the effects exerted on the surface state of the silicon wafer by the cleaning liquid were investigated. First, the silicon wafer (Cz, n(100)) was immersed for a period of 1 minute in DHF (0.5% HF), was then subjected to an ultrapure water rinse for 10 minutes, was cleaned for 10 minutes using ultrapure water having 2 ppm of ozone added thereto, and was then again subjected to a 10 minute ultrapure water rinse.

After this, a further immersion for a period of 1 minute was conducted in DHF, and then immersion was conducted for a period of 160 seconds while applying ultrasound (0.95 MHz) to cleaning liquids containing 30 wt % of IPA, and various fluoride compounds: KF, $NH_4F$, and HF at concentrations of 4.5 wt %, 4.8 wt %, and 0.5 wt %. Here, 160 seconds was the period of time required for the complete removal of the resist by IPA/HF/MS.

After cleaning, the surface roughness Ra of the silicon surface was measured at 30 points within the wafer surface by means of atomic force microscopy (AFM). The results are shown in Table 11.

TABLE 11

| | Surface Roughness Ra(nm) | Standard Deviation σn |
| --- | --- | --- |
| IPA KF MS | 0.113 | 0.006 |
| IPA $NH_4F$ MS | 0.229 | 0.03 |
| IPA HF MS | 0.354 | 0.02 |

As is clear from the table, the KF cleaning liquid does not produce a rough silicon surface; the surface value is identical to that after polishing. On the other hand, clearing liquids containing $NH_4F$ and HF produce rough surfaces in comparison with the cleaning liquid containing KF, and it was learned that there was large variation within the surface.

Next, an MOS capacitor was produced, and the relationship between the rough wafer surface produced by means of the resist peeling cleaning liquid, and the dielectric strength of the oxide film formed on the surface was investigated.

First, the method of production of the MOS capacitor will be explained. A n(100) type silicon wafer having a diameter of 33 mm was cleaned for 15 minutes using SPM ($H_2SO_4$: $H_2O_2$=4:1) for 15 minutes, was then cleaned with DHF (0.5 wt % HF) for 1 minute, and was then cleaned for a period of 10 minutes at 85°–90° C. using APM ($NH_4OH$: $H_2O_2$:$H_2O_2$=0.05:1:5), and then an ultrapure water rinse was conducted for 10 minutes.

A field oxide film was formed by 600 nm wet oxidation, and a photoresist having a thickness of 1 μm was formed in a manner identical to embodiment 1, and photolithography was conducted to produce a pattern of the desired form.

Next, the etching of the field oxide film was conducted for a period of 11 minutes using buffered hydrofluoric acid (LAL 700, produced by Hashimoto Kaasei), and an ultrapure water rinse was conducted for 10 minutes.

Next, the resist peeling was conducted by immersion in the three types of cleaning liquid described above, and the application of 0.95 MHz ultrasound thereto.

Next, after cleaning using SPM (10 minutes), DHF (1 minute), APM (10 minutes), and DHF (1 minute), immersion was conducted for a period of 20 minutes in ultrapure water containing 2 ppm of ozone, a preoxide was thus formed, and a gate oxide film was formed by dry oxidation at 900° C.

Next, after 500 nm of p-type poly Si was formed by CVD for the gate electrode, and annealing was conducted for 30 minutes at a temperature of 85° C., cleaning by means of SPM (5 minutes) and ultrapure water (3 minutes), was conducted, photolithography was conducted by a method identical to that described above, and then the etching of the poly Si was conducted using HF:$HNO_3$:$H_2O$ (0.02:1:1). After this, the resist was immersed in the cleaning liquid for a period of 160 seconds while applying ultrasound and was peeled off, and then cleaning was conducted using SPM (10 minutes), DHF (1 minute), and ultrapure water (3 minutes).

Next, $SiO_2$ was formed for a period of 18 minutes at a temperature of 400° C. by standard pressure CVD, and after patterning was conducted to the desired form, the pattern was formed by means of sputtering 1 μm of Al.

By means of the above procedures, an MOS capacitor having a gate electrode surface area of $1\times10^{-4}$ $cm^2$, and a gate oxide film thickness of 7.5 nm, was formed.

With respect to the MOS capacitor which was produced, the dielectric strength thereof was measured using a parameter analyzer HP4145A produced by Hewlett Packard. The dielectric strength was set to a voltage value in which a current density of $10^{-4}$ $A/cm^2$ flowed. The results are shown in Table 12.

Furthermore, in the same manner, a MOSFET was produced, and the mobility in the saturation region was determined from the slope of a graph of $I_D$ and $(V_G-V_{TH})^2$. Here, $I_D$ indicates the drain current, $V_G$ represents the gate voltage, and $V_{TH}$ represents the threshold value. The results thereof are also shown in Table 12.

TABLE 12

| | Dielectric Strength $E_{BD}$(MV/cm) | Mobility ($cm^2$/V · sec) |
| --- | --- | --- |
| IPA KF MS | 12.3 | 375 |
| IPA $NH_4F$ MS | 10.5 | 340 |
| IPA HF MS | 9.7 | 290 |

As is clear from the above, the cleaning liquid containing halogenated alkali metal salts of the present invention has a resist peeling effect which is higher than the cleaning liquids containing $NH_4F$ and HF, and moreover, such a liquid does not damage the silicon wafer, so that it is appropriate in the manufacture of highly functional devices.

In accordance with the present invention, extremely high cleaning effects can be obtained by means of a cleaning method in which, using a cleaning liquid comprising pure water, and organic solvent, and hydrofluoric acid and/or ammonium fluoride, or halogenated alkali metal salts such as potassium fluoride, potassium chloride, or the like, and by applying megasonic ultrasound to this cleaning liquid, an organic film adhering to a substrate is peeled off and removed.

The removal of the organic film such as the resist or the like in accordance with the present invention is accomplished by means of peeling from the substrate surface, not by means of dissolving the film using chemicals as was conventionally the case, so that if circulation and filtering of the organic film such as the resist or the like which is peeled are conducted, the organic film can be completely removed by the filters, so that the cleaning liquid remains essentially undegraded, and use thereof over a long period time is possible. Accordingly, if the cleaning fluid is passed in sequence through a crude filter, a medium filter, and fine filter after use in the cleaning apparatus of the present invention, this liquid may be reused. If two such filter systems are provided, and are used alternately in a cyclic manner, continuous operation is possible even while one filter system is being replaced.

In the present invention, it was confirmed that IPA/NH$_4$F/MS (with ultrasound in the MHz band), and IPA/KF/MS exhibited extremely good resist peeling. While the HF in the IPA/HF/MS tends to etch SiO$_2$ film, PSG film and BPSG film, IPA/NH$_4$F/MS and IPA/KF/MS do not etch SiO$_2$, PSG and BPSG, so that they are very preferable in the photolithographic process of the silicon. However, if an excimer laser stepper (KrF:248 nm, ArF:193 nm) is introduced in order to effect a further miniaturization of the pattern, the resist becomes a chemically amplified type resist, and becomes extremely sensitive to ammonia (NH$_3$), so that IPA/NH$_4$F cleaning liquid, which has the possibility of generating NH$_3$ vapors, is not preferable. The use of IPA/KF is preferable for the peeling of chemically amplified resist. The K remaining on the substrate surface after the peeling process may be removed by means of ultrasonic water cleaning; however, the K way be completely removed if washing is conducted with ultrapure water to which O$_3$ on the order of parts per million has been added, or with anode electrolysis ionized water.

The semiconductor substrate with the resist attached is contaminated. Accordingly, when the substrate having a resist is conveyed, cross-contamination may occur with differing substrates in the conveyance path or within the conveyance box.

The resist is essentially required from the photolithographic process to the following ion implantation or reactive ion etching (RIE). The immediate removal of the resist from the substrate after the completion of RIE or ion implantation is preferable. When the resist peeling technique by means of IPA/KF/MS of the present invention is introduced, by means of combining this with subsequent cleaning with ultrapure water having O$_3$ added, cleaning with HF/$_2$O$_2$ having a surfactant added (megasonic) and ultrasonic cleaning, then resist peeling and surface cleaning are conducted by means of room temperature processes and a clean substrate having no remaining K can be obtained.

If IPA and vapor drying and N$_2$ gas blow drying are introduced in the cleaning apparatus of the present invention, and the RIE process is appended immediately after ion implantation, then only those substrates having no adhering resist will be conveyed.

The present invention is appropriately applied to the peeling of photoresist; in comparison with conventional peeling methods, it exhibits a strong cleaning and removal effect, and provides a clean surface. Additionally, because treatment is conducted at or about room temperature, the procedure has superior ease of manipulation and stability, and moreover, waste liquid treatment is a simple matter. A room temperature wet cleaning technology employing absolutely no high temperature or high concentration chemicals was previously disclosed by the present inventors (Tadahiro Obmi, Ultra Clean ULST Technology, Baifuukan, December, 1995).

By means of combinations with the resist peeling technology of the present invention, it will be possible to completely eliminate chemicals in high concentrations, such as sulfuric acid, hydrochloric acid, nitric acid, ammonia, and the like from semiconductor factories and liquid crystal factories.

What is claimed is:

1. A cleaning method, comprising the steps:
applying ultrasound to a cleaning solution comprising a mixture of organic solvent diluted with pure water and halogenated alkali salts; applying said cleaning solution to which ultrasound is applied to a substrate; and thereby, peeling away an organic film adhering to said substrate.

2. A cleaning method in accordance with claim 1, characterized in that said halogenated alkali salts comprise potassium fluoride or potassium chloride.

3. A cleaning method in accordance with claim 2, characterized in that the concentration of said potassium fluoride is within a range of 0.005–10 wt %.

4. A cleaning method in accordance with claim 2, characterized in that the concentration of said potassium chloride is within a range of 0.05–10 wt %.

5. A cleaning method in accordance with claim 1, characterized in that said substrate is raised out of and lowered into said cleaning solution during cleaning.

6. A cleaning method in accordance with claim 1, characterized in that during cleaning, said substrate is oscillated and/or a jet shower is supplied within said cleaning solution to said substrate.

7. A cleaning method in accordance with claim 1, characterized in that an inner tank containing said cleaning solution is placed within an outer tank containing a liquid, and by means of disposing an ultrasonic oscillator at said outer tank, ultrasound is applied to said cleaning liquid.

8. A cleaning method in accordance with claim 1, characterized in that the application of ultrasound to said cleaning solution is conducted intermittently.

9. A cleaning method in accordance with claim 1, characterized in that said substrate is caused to rotate.

10. A cleaning method in accordance claim 1, characterized in that the atmosphere surrounding said substrate is set to 50 Torr or less.

11. A cleaning method in accordance claim 1, characterized in that the temperature of said cleaning solution is within a range of 15°–40° C.

12. A cleaning method in accordance with claims 1, characterized in that said organic solvent comprises isopropyl alcohol.

13. A cleaning method in accordance with claim 1, characterized in that cleaning is conducted at a concentration of said organic solvent within a range of 4–90 wt %.

14. A cleaning method in accordance with one of claims 1, characterized in that the frequency of said ultrasound is within a range of 0.8–10 MH$_2$ whereby a photoresist is removed by peeling away from a semiconductor.

15. A cleaning method in accordance with claim 1, characterized in that prior to the removal of an organic film by means of said cleaning solution, treatment is conducted with a solvent as a pretreatment.

16. A cleaning method in accordance with claim 15, characterized in that said solvent comprises one of isopropyl alcohol and dimethyl sulfoxide.

17. A cleaning method in accordance with claim 1, characterized in that pretreatment by means of said solvent is conducted in an atmosphere such that the moisture concentration is 1 ppm or less.

18. A cleaning method in accordance with claim 1, characterized in that said organic film comprises a photoresist.

19. A cleaning method in accordance with claim 18, characterized in that said photoresist is deposited on the substrate after ion implantation and/or reactive ion etching.

20. A cleaning method in accordance with claim 1, characterized in that scratches are made in said organic film.

21. A cleaning method, comprising the steps applying ultrasound to a cleaning liquid comprising a mixture of an organic solvent diluted with pure water and halogenated alkali salts, while said cleaning liquid is applied to the rear surface of a substrate after the application of a photoresist, and an organic film adhering to said rear surface of the substrate is peeled away.

22. A cleaning method, comprising the steps:
applying ultrasound to a cleaning liquid comprising a mixture of an organic solvent diluted with pure water and one of hydrofluoric acid and ammonium fluoride while said cleaning liquid is supplied to a substrate, and an organic film adhering to the surface of the substrate is peeled away.

23. A cleaning method in accordance with claim 22, characterized in that the concentration of said hydrofluoric acid is within a range of 0.01–0.5 wt %.

24. A cleaning method in accordance with claim 22, characterized in that the concentration of said ammonium fluoride is within a range of 0.6–6.5 wt %.

25. A cleaning method comprising the steps:
applying ultrasound to a cleaning liquid comprising a mixture of an organic solvent diluted with pure water and one of hydrofluoric acid and ammonium fluoride while said cleaning liquid is supplied to a rear surface of a substrate after the application of a photoresist thereto, and an organic film adhering to the rear surface to the substrate is peeled away.

* * * * *

UNITED STATES PATENT AND TRADEMARK OFFICE
CERTIFICATE OF CORRECTION

PATENT NO. : 5,858,106
DATED : Jan. 12, 1999
INVENTOR(S) : Tadahiro Ohmi, et al

It is certified that error appears in the above-identified patent and that said Letters Patent is hereby corrected as shown below:

On cover page, item [75], Miyagi-den" should read --Miyagi-ken-- and --Bunkyo-ku" should read --Tokyo--

Signed and Sealed this

First Day of June, 1999

Attest:

Attesting Officer

Q. TODD DICKINSON

Acting Commissioner of Patents and Trademarks